United States Patent
Maury et al.

(10) Patent No.: US 6,368,972 B1
(45) Date of Patent: Apr. 9, 2002

(54) METHOD FOR MAKING AN INTEGRATED CIRCUIT INCLUDING ALIGNMENT MARKS

(75) Inventors: Alvaro Maury; Scott Francis Shive, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/345,039

(22) Filed: Jun. 30, 1999

Related U.S. Application Data

(60) Provisional application No. 60/115,527, filed on Jan. 12, 1999.

(51) Int. Cl.[7] .......................................... H01L 21/302
(52) U.S. Cl. .................... 438/692; 438/693; 438/706; 438/723; 438/724; 438/743; 438/744
(58) Field of Search ................. 438/706, 723, 438/724, 743, 744, 690–693

(56) References Cited

U.S. PATENT DOCUMENTS

| | | | | |
|---|---|---|---|---|
| 5,640,053 A | * | 6/1997 | Caldwell | 257/797 |
| 5,731,241 A | * | 3/1998 | Jang et al. | 438/424 |
| 5,786,260 A | * | 7/1998 | Jang et al. | 438/401 |
| 5,893,744 A | * | 4/1999 | Wang | 438/401 |
| 6,037,236 A | * | 3/2000 | Jang | 438/401 |
| 6,043,133 A | * | 3/2000 | Jang et al. | 438/401 |

* cited by examiner

*Primary Examiner*—Benjamin L. Utech
*Assistant Examiner*—Charlotte A. Brown
(74) *Attorney, Agent, or Firm*—Allen, Dyer, Doppelt, Milbrath & Gilchrist, P.A.

(57) ABSTRACT

A method for making an integrated circuit preferably includes the steps of: forming a trench laterally adjacent an active region in a semiconductor substrate; forming a dielectric layer on the semiconductor substrate filling the trench and covering the active area; selectively etching the dielectric layer to remove at least a portion of the dielectric layer overlying the active region and to define a recess within the dielectric layer filling the trench to serve as an alignment mark; and polishing the selectively etched dielectric layer and leaving the alignment mark. The method may also include forming an optically opaque layer adjacent the polished dielectric layer and with the alignment mark causing a repeated alignment mark in the optically opaque layer. The alignment mark and/or repeated alignment mark may be used for alignment in a subsequent processing step. The alignment mark can be made with a step height which is greater than a conventional alignment mark formed by the step height difference between the active area and the dielectric layer of the trench. Accordingly, variations in polishing, for example, will not obscure or remove the alignment mark made in accordance with the present invention.

25 Claims, 6 Drawing Sheets

ND FOR MAKING AN INTEGRATED
METHOD FOR MAKING AN INTEGRATED CIRCUIT INCLUDING ALIGNMENT MARKS

RELATED APPLICATION

This application is based upon prior filed copending provisional application Ser. No. 60/115,527 filed Jan. 12, 1999.

FIELD OF THE INVENTION

The present invention relates to the field of semiconductor processing, and, more particularly, to a method for ensuring proper alignment during successive processing steps.

BACKGROUND OF THE INVENTION

Integrated circuits are widely used in many electronic devices, such as cellular telephones, computers, etc. A typical integrated circuit includes a semiconductor substrate which, in turn, may include many thousands or millions of transistors. A transistor may be formed in a active region of the substrate. Adjacent active regions are separated by isolation regions. For example, a technology known as shallow trench isolation (STI) provides an oxide filled trench to isolate adjacent active regions.

Multiple layers of conductors and insulating layers are patterned and built in successive layers to form the integrated circuit. Typically a plurality of integrated circuits are formed on a single semiconductor wafer, which is later cut into discrete chips. It is important during the various processing steps to align each subsequent layer to the underlying or previous layer with a high degree of accuracy. The accuracy of the alignment is typically an important factor in determining manufacturability and yields. A wafer stepper tool is typically used to transfer a desired pattern on a reticle into a layer on the wafer. In a typical process, the wafer has alignment marks thereon and the stepper uses the alignment marks on the wafer as the reference locations for setting the position of the reticle on the wafer for precise alignment. Although an original alignment mark is covered by subsequent layers, in some processes the step height is replicated in the later added layers. Unfortunately, as noted in U.S. Pat. No. 5,640,053 to Caldwell, alignment marks may be difficult to use in combination with global planarization techniques, such as chemical-mechanical polishing (CMP). In some cases, the alignment marks may still be visible through a covering layer, such as an interlevel dielectric (ILD) layer.

In the manufacturing of some integrated circuits, a transistor gate stack is formed of a tungsten silicide layer on a polysilicon layer. A thin gate oxide separates the polysilicon from the channel region formed in the substrate. The tungsten silicide layer is optically opaque. To align the gate mask to the trench oxide, a residual topography is therefore formed to provide alignment marks. FIG. 1, for example, illustrates a portion of an integrated circuit patterned with reverse tone photoresist layer 21. Beneath the photoresist layer 21 is an oxide or dielectric layer 22 overlying the illustrated silicon active area 23 and adjacent trench 24. The purpose of the reverse tone photoresist layer 21 is to selectively etch higher regions of the dielectric layer 22 to facilitate later polishing.

The trench 24 and active area 23 are formed in a semiconductor substrate 25. The active area 23 includes an oxide/nitride stack 26 thereon which will serve as an etch stop layer. Of course, in the integrated circuit 20 may such active regions and isolation trenches are formed, and a wafer will, in turn, include many such integrated circuit chips.

FIG. 2 shows the integrated circuit 20 after etching the dielectric layer 22 and removing of the photoresist layer 21. FIG. 3 shows the integrated circuit 20 after chemomechanical polishing (CMP) wherein the device is planarized to the oxide/nitride layer 26. After the oxide/nitride stack 26 is removed, the integrated circuit 20 has a step height at the location designated with reference numeral 30 which is between the top of the trench oxide and the laterally adjacent active silicon area 23.

FIG. 4 illustrates the integrated circuit 20 after the addition of a polysilicon layer 27 and an upper tungsten silicide layer 28. The step height defined between the top of the trench oxide and the active region 23 is repeated in the step height at the location indicated by 31 on the overlying stacked gate structure of the polysilicon and tungsten silicide layers 27, 28. A typical targeted dimension for an alignment structure is about 1000 Å. Unfortunately, because of the inherent CMP non-uniformity, and subsequent HF cleaning steps, the step height can be reduced in some areas of the wafer to near zero. Once this step height 30 is almost planarized alignment can become extremely unreliable or impossible to use for subsequent processing steps.

SUMMARY OF THE INVENTION

In view of the foregoing background, it is therefore an object of the present invention to provide a method for making and using alignment marks in integrated circuit manufacturing.

This and other objects, features, and advantages in accordance with the present invention are provided by a method for making an integrated circuit comprising the steps of: forming a trench laterally adjacent an active region in a semiconductor substrate; forming a dielectric layer on the semiconductor substrate filling the trench and covering the active area; and selectively etching the dielectric layer to remove at least a portion of the dielectric layer overlying the active region, and to define a recess within the dielectric layer filling the trench to serve as an alignment mark. The method also preferably includes the steps of polishing the selectively etched dielectric layer and leaving the alignment mark.

The method may also include the steps of forming an optically opaque layer adjacent the polished dielectric layer and with the alignment mark causing a repeated alignment mark in the optically opaque layer. The active area preferably includes an etch stop layer thereon. Accordingly, the method also preferably includes the step of stripping the etch stop layer from the active area prior to forming the optically opaque layer. Of course the alignment mark and/or repeated alignment mark may be used for alignment in a subsequent processing step. The alignment mark can be made with a step height which is greater than a conventional alignment mark formed by the step height difference between the active area and the dielectric layer of the trench. Accordingly, variations in polishing, for example, will not obscure or remove the alignment mark made in accordance with the present invention.

The recess defining the alignment mark preferably has a depth of at least about 1000 Å. In addition, to avoid the accumulation of undesired particles therein, the recess may define the alignment mark having an area of greater than about 1 $\mu m^2$.

The step of selectively etching the dielectric layer preferably comprises selectively etching using a reverse tone photoresist layer. In the embodiment of the invention described so far, the alignment of a subsequent gate layer, for example, is made with respect to the reverse tone photoresist layer. The photoresist layer, in turn, is aligned with respect to the active region. However, in another embodiment of the invention the gate may be aligned directly with the active region. More particularly, the method may include the step of forming at least one substrate portion to extend upwardly into the trench to define edges aligned with the active region. In other words, the step of forming the trench preferably comprises selectively etching the trench in the semiconductor substrate. The step of forming the at least one substrate portion to extend upwardly into the trench is preferably carried out as part of the selective etching of the trench which leaves the silicon mesa for the active region.

In accordance with another aspect of the invention, the method may further comprise the step of using the alignment mark to monitor a thickness of the dielectric layer removed during the selectively etching step thereof. For example, a profilometer may be used to monitor the thickness after etching.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
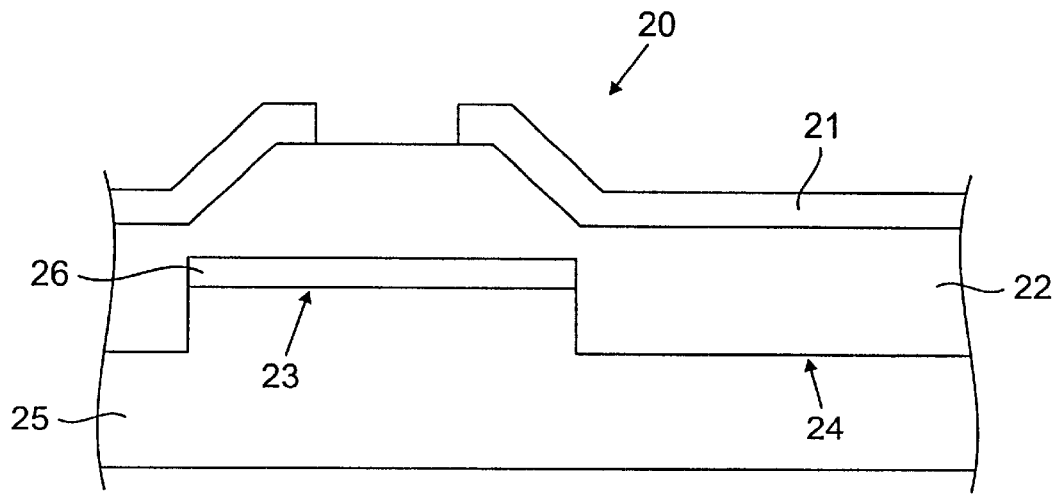
FIGS. 1–5 are schematic cross-sectional views of an integrated circuit portion during the manufacturing thereof as in the prior art.
Figure 2:
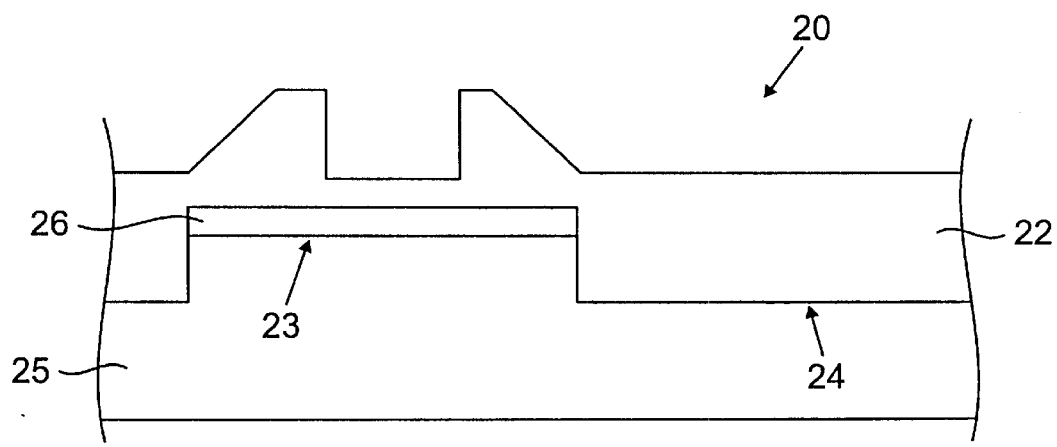
Figure 3:
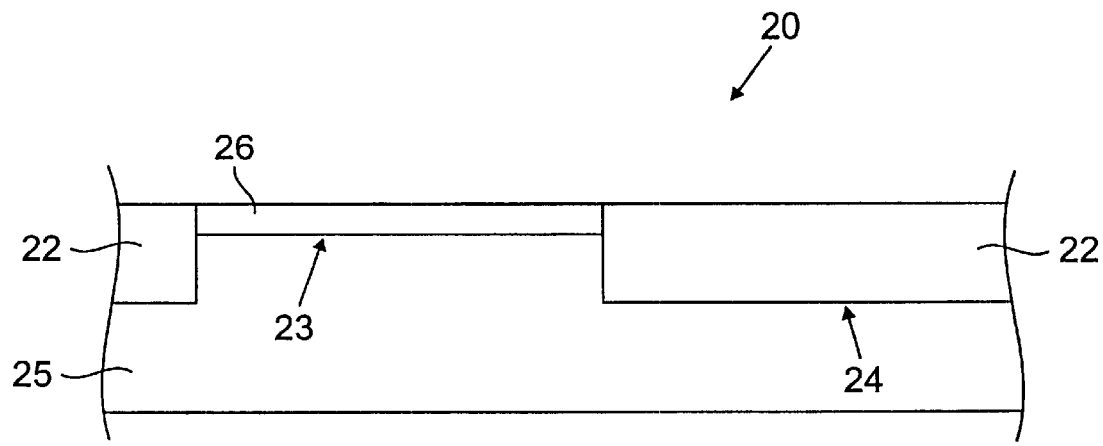
Figure 4:
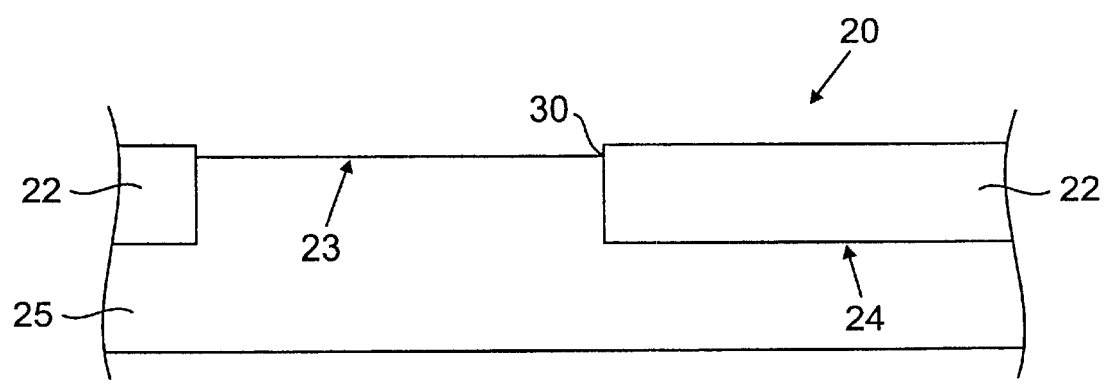
Figure 5:
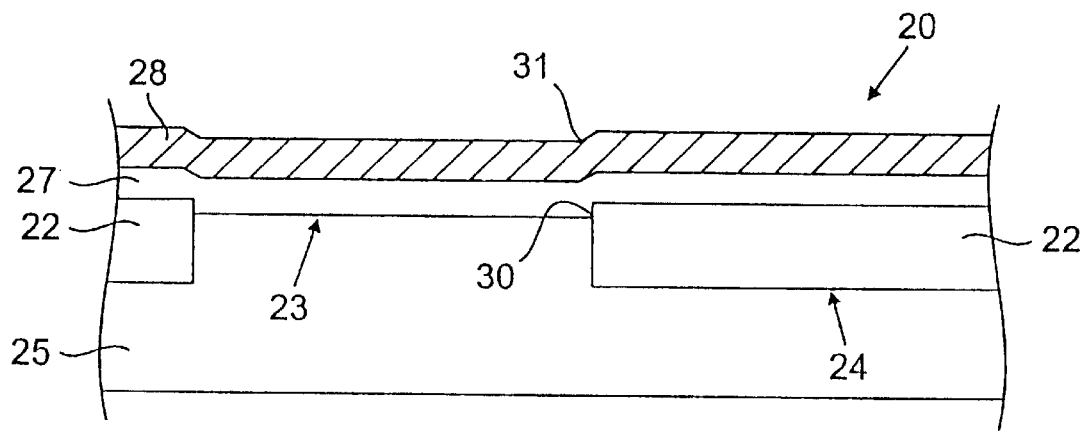
Figure 6:
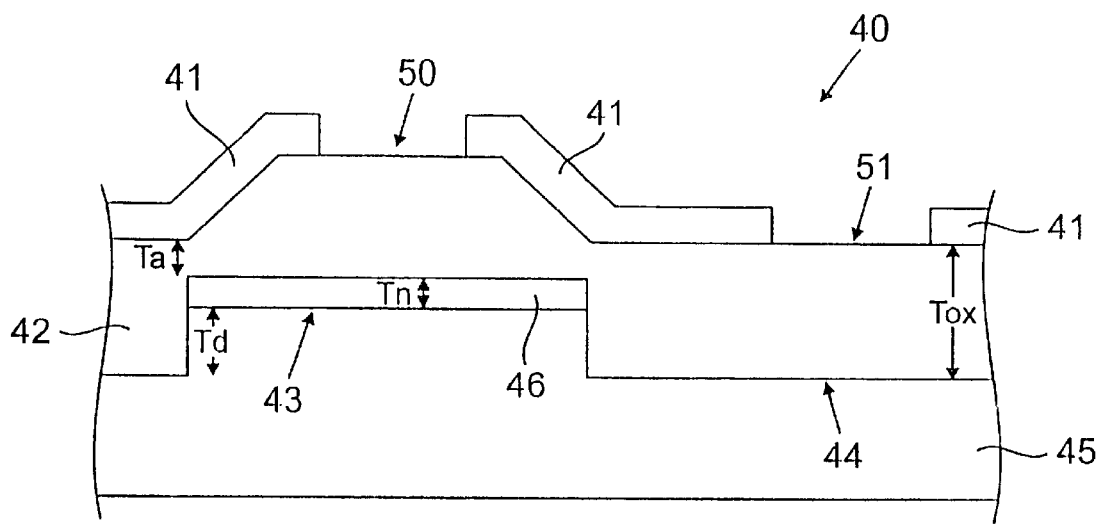
FIGS. 6–9 are schematic cross-sectional views of an integrated circuit portion during the manufacturing thereof in accordance with the present invention.

Referring initially to FIGS. 6 to 9, the method according to the invention is now described. As discussed above in the background of the invention section, the method is directed to providing an alignment mark in a shallow trench isolation process that includes polishing, and which also may use an opaque material, such as tungsten silicide for the gate stack. The method for making the integrated circuit 40 comprises the step of forming a trench 44 laterally adjacent an active region 43 in a semiconductor substrate 45 as shown in FIG. 6. The trench 44 may be a shallow trench formed by conventional patterning and etching techniques as will be readily understood by those skilled in the art. The adjacent active area 43 includes an oxide/nitride layer 46 thereon which will serve as an etch stop later in the process.

A dielectric layer 22 is formed on the semiconductor substrate 25 so as to fill the trench 44 and cover the active area 43. The dielectric layer 22 may be a deposited silicon dioxide layer as will be readily appreciated by those skilled in the art, although other materials and combinations of various materials and layers are also contemplated by the present invention.

As shown in FIG. 6, a reverse tone photoresist layer 41 is formed on the dielectric layer 22 and selectively developed and etched to leave a first opening 50 over the dielectric region 22 which, in turn, overlies the active area 43. In accordance with the invention, a second opening 51 is formed over the dielectric layer 22 overlying the trench 44 during the etching and which produces the structure shown in FIG. 7 after etching. A number of relevant thicknesses are illustrated including: Td which is the depth of the trench 44, Tn which is thickness of the oxide/nitride layer 46, Tox which is the thickness of the dielectric layer 22, Ta which is the step height between the top of the trench dielectric and the top of the oxide/nitride layer, Te which is the thickness removed in the etching using the reverse tone photoresist layer 41, and Tr which is the thickness remaining at the bottom of the recess defining the alignment mark 56 in the trench.

Figure 7:
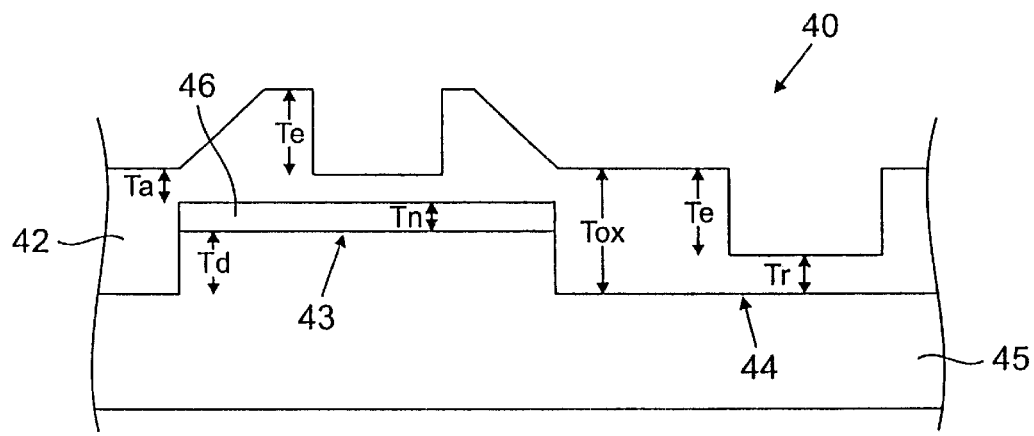

From FIGS. 6 and 7 it is readily appreciated that Tox=Td+Tn+Ta, and Tox=Te+Ta, since Te=Tn+Td. Also, Tox=Te+Tr, since Tr=Ta. After CMP and stripping of the etch stop provided by the oxide/nitride layer 46, the structure 40 will appear as in FIG. 8. The CMP and stripping step are performed in a conventional fashion as will be appreciated by those skilled in the art and require no further discussion herein.

Figure 8:
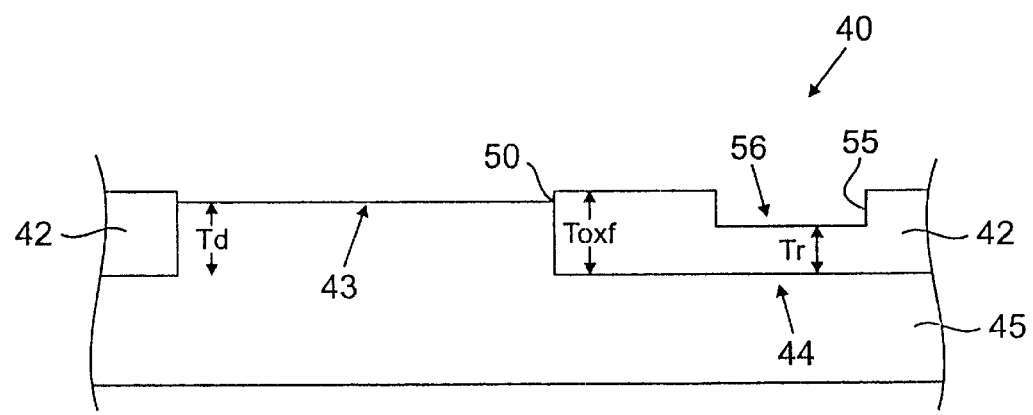

The conventional step height is shown at the interface between the top of the dielectric layer 22 over the trench 44 and the active region 43 in FIG. 8 as is indicated by reference numeral 50. Calling the final thickness of the trench 44 Toxf, it can be seen that the step height at 50 is equal to Toxf–Ta. In contrast, the step height at 55 created by the alignment mark 56 in the trench dielectric is equal to Toxf–Td. Accordingly, it can be seen that in the case of excessive planarization during CMP, the final trench dielectric thickness Toxf can be very close to the trench depth Td, so that the step height at 50 approaches zero and is unusable for alignment. In contrast, the step height at 55 produced by the alignment mark 56 can still be made to have a sufficiently high value to perform correctly. For example, if Td=3000 Å, Tn=1300 Å, and Tox=6300 Å, then Ta=2000 Å. Accordingly, the step height at 55 for the alignment mark 56 will be 10000 Å if Toxf=Td=3000 Å.

A final topography of at least about 1000 Å should be sufficient to perform reliable alignment as will be readily appreciated by those skilled in the art. In addition, to reduce the chance of particle accumulation in the alignment mark 56, its size may be made greater than about 1 $\mu m^2$, for example. This provides an alignment mark 56 with a low enough aspect ratio to have a low probability of trapping particles therein.

Of course, the alignment mark 56 and/or the repeated alignment mark 57 may be used for alignment in one or more subsequent processing steps, particularly as relating to formation of the gate stack as will be readily appreciated by those skilled in the art. The alignment mark 56 can be made with a step height at 55 which is greater than a conventional alignment mark formed by the step height at 50 between the active area and the dielectric layer of the trench. These respective step heights at 55, 50 are transferred or repeated at the respective gate stack step heights at 57, 51. Accordingly, variations in polishing, for example, will not obscure or remove the alignment mark 56 made in accordance with the present invention.

In accordance with another aspect of the invention, the method may further comprise the step of using the alignment mark 56 to monitor a thickness Te of the dielectric layer 42 removed during the selectively etching thereof. For example, a profilometer may be used to monitor the thickness after etching as will be readily appreciated by those skilled in the art.

Figure 9:
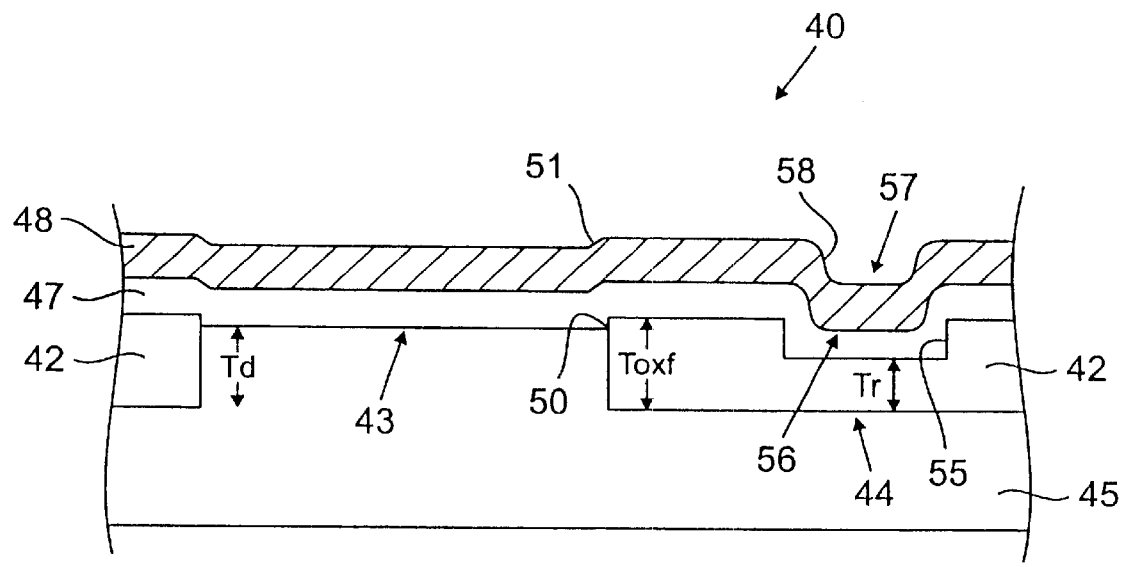

As shown in FIG. 9, the method may also include the steps of forming an optically opaque layer, such as the tungsten silicide layer 48 adjacent the polished dielectric layer 42 and with the alignment mark 56 causing a repeated alignment mark 57 in the tungsten silicide layer. The tungsten silicide layer 48 is illustratively provided over a polysilicon gate layer 47. As will be readily appreciated by those skilled in the art, a relatively thin gate oxide layer, not shown, is typically provided over the active area 43, and the active area may typically include a channel region. In addition, tungsten silicide is but one material used in a gate stack or semiconductor manufacturing that may be optically opaque as will be readily appreciated by those skilled in the art.

In the embodiment of the invention described so far, the alignment of a subsequent gate stack, that is, polysilicon and tungsten silicide layers 47, 48, for example, is made with respect to the reverse tone photoresist layer 41. The photoresist layer 41, in turn, is aligned with respect to the active area 43 as will be appreciated by those skilled in the art. It may be possible that alignment tolerance considerations cause it to be more desirable to align the gate layers 67, 68 directly with the active area 43.

Figure 10:
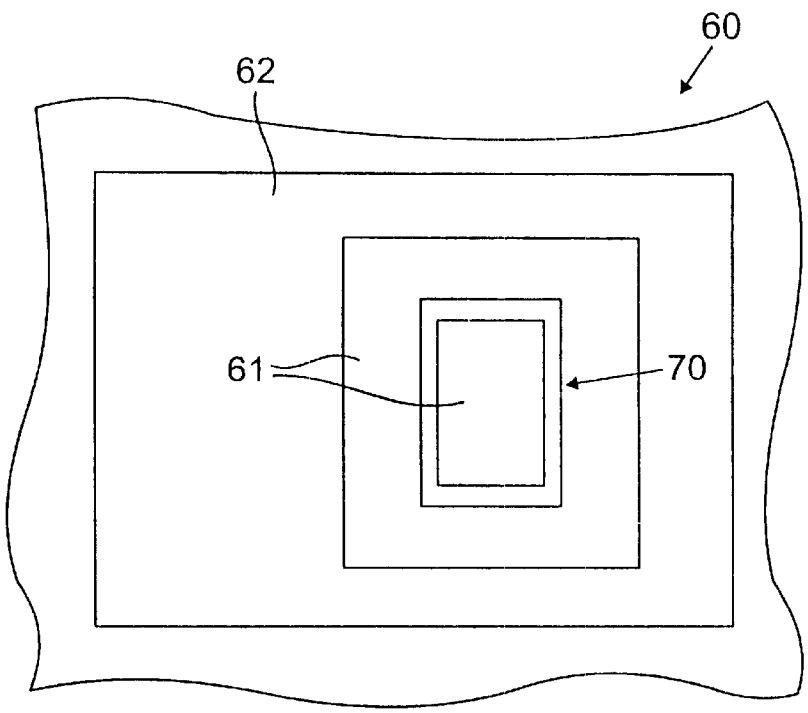
FIG. 10 is a top plan view of an integrated circuit portion during manufacturing thereof in accordance with a second embodiment of the invention.
Figure 11:
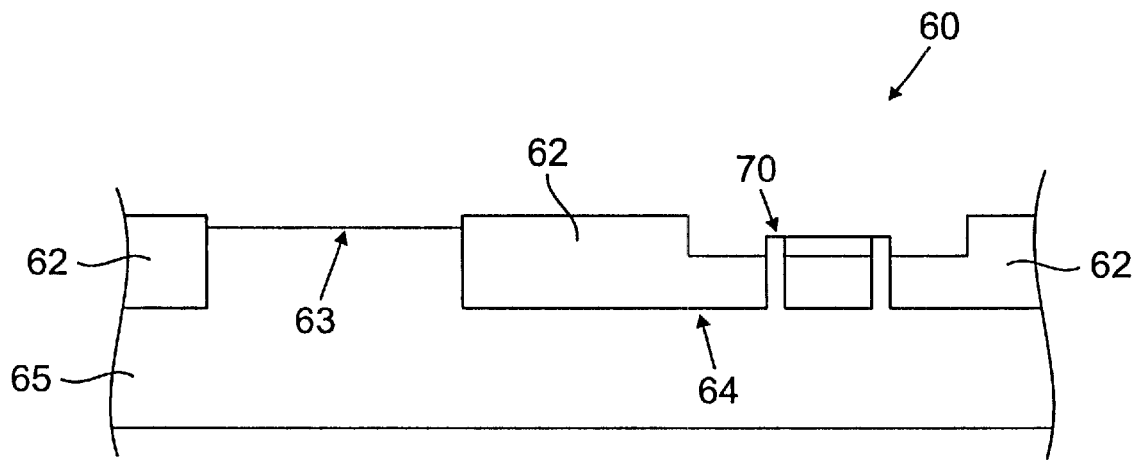
FIGS. 11 and 12 are schematic cross-sectional views of an integrated circuit portion during manufacturing thereof in accordance with the second embodiment of the invention as shown in FIG. 10.
Figure 12:
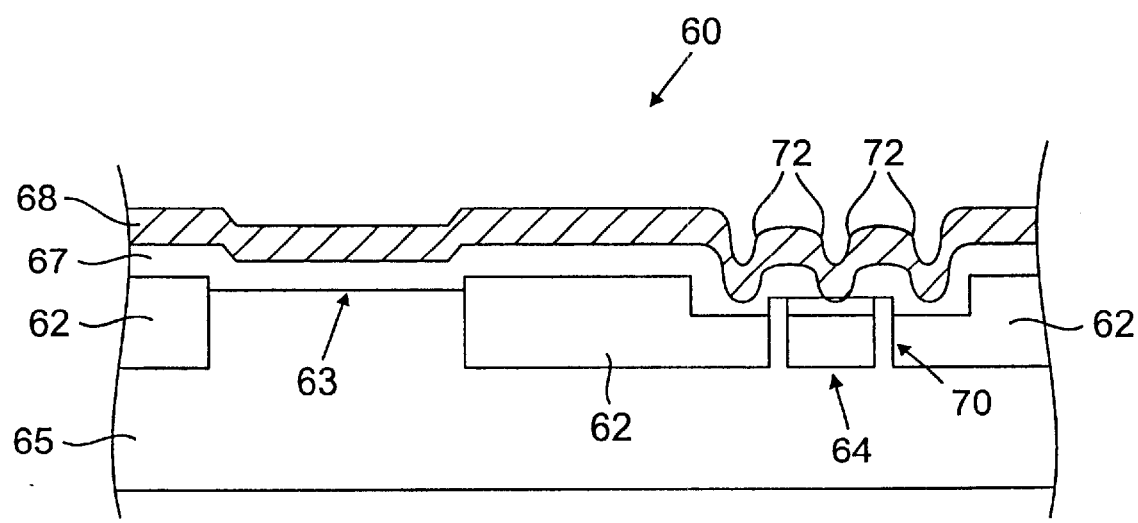

In the embodiment of the invention as now explained with reference to FIGS. 10 to 12, the gate layers 67, 68 may be aligned directly with the active area 63 of the integrated circuit structure 60. The method may include the step of forming at least one substrate portion to extend upwardly into the trench 64 to define, for example, edges aligned with the active region 63. In other words, the step of forming the trench 64 preferably comprises selectively etching the trench in the semiconductor substrate 65. Thus, the step of forming the at least one substrate portion to extend upwardly into the trench 64 is preferably carried out as part of the selective etching of the trench and which leaves the active area 63.

More particularly, as shown in the illustrated embodiment with reference to FIG. 10, a frame 70 with narrow lines is patterned, and later a box is opened around it with the reverse tone photoresist layer 61 as will be readily appreciated by those skilled in the art. The frame 70 generates the series of alignment edges or marks 72 in the gate stack for use in subsequent alignment steps as will be readily appreciated by those skilled in the art.

The alignment marks and repeated alignment marks may be formed in the streets of the wafer, that is, the pattern of grid lines between the individual integrated circuits. Accordingly, these alignment marks are removed prior to final device packaging. In other embodiments, the alignment marks may be formed in areas of the individual integrated circuits as will be readily understood by those skilled in the art. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making an integrated circuit comprising the steps of:
   forming a trench laterally adjacent an active region in a semiconductor substrate;
   forming a dielectric layer on the semiconductor substrate filling the trench and covering the active area;
   selectively etching the dielectric layer to remove at least a portion of the dielectric layer overlying the active region and to define a recess within the dielectric layer filling the trench to serve as an alignment mark;
   polishing the selectively etched dielectric layer and leaving the alignment mark;
   forming an optically opaque layer adjacent the polished dielectric layer and with the alignment mark causing a repeated alignment mark in the optically opaque layer; and
   using the repeated alignment mark for alignment in a subsequent processing step.

2. A method according to claim 1 wherein the recess defining the alignment mark has a depth of at least about 1000 Å.

3. A method according to claim 1 wherein the recess defining the alignment mark has an area of greater than about 1 $\mu m^2$.

4. A method according to claim 1 further comprising the step of forming at least one substrate portion to extend upwardly into the trench to define edges aligned with the active region.

5. A method according to claim 4 wherein the step of forming the trench comprises selectively etching the trench in the semiconductor substrate; and wherein the step of forming the at least one substrate portion to extend upwardly into the trench is carried out as part of the selective etching of the trench.

6. A method according to claim 1 further comprising the step of using the alignment mark to monitor a thick ness of th e dielectric layer removed during the selectively etching step thereof.

7. A method according to claim 6 wherein the step of using the alignment mark to monitor a thickness comprises using a profilometer.

8. A method according to claim 1 wherein the step of selectively etching comprises selectively etching using a reverse tone photoresist layer.

9. A method according to claim 1 wherein the active area includes an etch stop layer thereon, and further comprising the step of stripping the etch stop layer from the active area prior to forming the optically opaque layer.

10. A method for making an integrated circuit comprising the steps of:
    selectively etching a semiconductor substrate to form a trench laterally adjacent an active region in a semiconductor substrate, and with the trench including at least one substrate portion extending upwardly in the trench;
    forming a dielectric layer on the semiconductor substrate filling the trench and covering the active area;
    selectively etching the dielectric layer to define a recess within the dielectric layer filling the trench, the at least one upwardly extending substrate portion serving as an alignment mark;
    polishing the selectively etched dielectric layer and leaving the alignment mark; and
    using the alignment mark in a subsequent processing step.

11. A method according to claim 10 further comprising the step of forming an optically opaque layer adjacent the polished dielectric layer and with the alignment mark causing a repeated alignment mark in the optically opaque layer.

12. A method according to claim 11 wherein the active area includes an etch stop layer thereon, and further comprising the step of stripping the etch stop layer from the active area prior to forming the optically opaque layer.

13. A method according to claim 10 wherein the recess defining the alignment mark has a depth of at least about 1000 Å.

14. A method according to claim 10 wherein the recess defining the alignment mark has an area of greater than about 1 $\mu m^2$.

15. A method according to claim 10 further comprising the step of using the alignment mark to monitor a thickness of the dielectric layer removed during the selectively etching step thereof.

16. A method according to claim 10 wherein the step of selectively etching comprises selectively etching using a reverse tone photoresist layer.

17. A method according to claim 10 wherein the step of selectively etching further comprises removing portions of the dielectric layer overlying the active area.

18. A method for making an integrated circuit comprising the steps of:

forming a trench laterally adjacent an active region in a semiconductor substrate;

forming a dielectric layer on the semiconductor substrate filling the trench and covering the active area;

selectively etching the dielectric layer to define a recess within the dielectric layer filling the trench to serve as an alignment mark;

polishing the selectively etched dielectric layer and leaving the alignment mark; and using the alignment mark in a subsequent processing step.

19. A method according to claim 18 further comprising the step of forming an optically opaque layer adjacent the polished dielectric layer and with the alignment mark causing a repeated alignment mark in the optically opaque layer.

20. A method according to claim 19 wherein the active area includes an etch stop layer thereon, and further comprising the step of stripping the etch stop layer from the active area prior to forming the optically opaque layer.

21. A method according to claim 18 wherein the recess defining the alignment mark has a depth of at least about 1000 Å.

22. A method according to claim 18 wherein the recess defining the alignment mark has an area of greater than about 1 $\mu m^2$.

23. A method according to claim 18 further comprising the step of using the alignmen mark to monitor a thickness of the dielectric layer removed during the selectively etching step thereof.

24. A method according to claim 18 wherein the step of selectively etching comprises selectively etching using a reverse tone photoresist layer.

25. A method according to claim 18 wherein the step of selectively etching further comprises removing portions of the dielectric layer overlying the active area.

* * * * *